United States Patent
Kim et al.

(10) Patent No.: US 7,651,948 B2
(45) Date of Patent: Jan. 26, 2010

(54) PRE-CLEANING OF SUBSTRATES IN EPITAXY CHAMBERS

(75) Inventors: Yihwan Kim, Milpitas, CA (US); Jean R. Vatus, San Jose, CA (US); Lori D. Washington, Union City, CA (US); Arkadii Samoilov, Sunnyvale, CA (US); Ali Zojaji, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/480,134

(22) Filed: Jun. 30, 2006

(65) Prior Publication Data

US 2008/0245767 A1    Oct. 9, 2008

(51) Int. Cl.
 *H01L 21/302* (2006.01)
(52) U.S. Cl. ............... 438/714; 438/706; 438/715; 438/716; 134/1.2
(58) Field of Classification Search ............. 438/706, 438/710, 712, 714, 720, 715, 716; 134/1.1, 134/1.2
See application file for complete search history.

(56) References Cited

U.S. PATENT DOCUMENTS

| | | | |
|---|---|---|---|
| 5,308,788 A | 5/1994 | Fitch et al. | |
| 5,670,421 A * | 9/1997 | Nishitani et al. | 438/641 |
| 6,129,091 A | 10/2000 | Lee et al. | |
| 6,494,959 B1 | 12/2002 | Samoilov et al. | |
| 6,579,730 B2 | 6/2003 | Li et al. | |
| 6,635,185 B2 * | 10/2003 | Demmin et al. | 216/64 |
| 6,692,903 B2 | 2/2004 | Chen et al. | |
| 6,991,991 B2 | 1/2006 | Cheng et al. | |
| 6,995,077 B2 * | 2/2006 | Siebert et al. | 438/478 |
| 2004/0256671 A1 | 12/2004 | Huang et al. | |
| 2005/0148162 A1 | 7/2005 | Chen et al. | |
| 2005/0230350 A1 | 10/2005 | Kao et al. | |
| 2006/0057821 A1 * | 3/2006 | Lee et al. | 438/459 |
| 2006/0071213 A1 | 4/2006 | Ma et al. | |

OTHER PUBLICATIONS

"PCT Search Report (May 28, 2008) PCT/US07/72469".
"PCT Written Opinion (May 28, 2008)—PCT/US07/72469".

* cited by examiner

*Primary Examiner*—Lan Vinh
(74) *Attorney, Agent, or Firm*—Diehl Servilla LLC; Scott S. Servilla

(57) ABSTRACT

A method for processing a substrate including a pre-cleaning etch and reduced pressure process is disclosed. The pre-cleaning process involves introducing a substrate into a processing chamber; flowing an etching gas into the processing chamber; processing at least a portion of the substrate with the etching gas to remove a contaminated or damaged layer from a substrate surface; stopping flow of the etching gas; evacuating the processing chamber to achieve a reduced pressure in the chamber; and processing the substrate surface at the reduced pressure. Epitaxial deposition is then used to form an epitaxial layer on the substrate surface.

20 Claims, 4 Drawing Sheets

PRE-CLEANING OF SUBSTRATES IN EPITAXY CHAMBERS

BACKGROUND

Embodiments of the present invention pertain to methods of pre-cleaning substrates in epitaxy chambers, systems, and apparatus. In particular, epitaxial deposition methods, systems, and apparatus that involve a cleaning process used to remove surface defects and contaminants prior to the epitaxy process are disclosed.

An epitaxial layer is a crystalline film grown over a crystalline substrate. The underlying substrate acts as a template for the growing film, so that the crystallographic characteristics of the epitaxial layer are defined by the underlying crystalline substrate. That is, the crystalline substrate provides a crystallographic seed for the epitaxial growth. The substrate may be, for example, monocrystalline silicon, silicon germanium, or an SOI wafer.

Growth of the epitaxial layer is commonly achieved using chemical vapor deposition (CVD). The substrate wafer is loaded into a CVD reactor, which is then purged with a non-reactive gas such as He, Ar, $N_2$, or $H_2$. The temperature of the reactor is ramped up, and a mixture of a carrier gas and a reactive gas is introduced into the reactor. Reactive gases may include, but are not limited to, silane ($SiH_4$), disilane ($Si_2H_6$), trisilane ($Si_3H_8$), dichlorosilane ($SiH_2Cl_2$), trichlorosilane ($SiHCl_3$), and silicon tetrachloride ($SiCl_4$). Dopant gases may also be introduced, such as arsine ($AsH_3$), phosphine ($PH_3$) and diborane ($B_2H_6$). The carrier gas is typically hydrogen. When a desired thickness of the epitaxial layer has been achieved, non-reactive gases are again used to purge the reactor, and the temperature is ramped down.

However, for the epitaxial process to perform successfully, it is important that the amount of defects and contaminants present on the crystalline substrate be minimized. Crystallinity damage and contaminants on the crystalline substrate may arise during processing steps such as, for example, implantation, spacer etching, wet cleaning, and any other wafer fabrication step. The damaged and/or contaminated layer should be removed to avoid defects prior to the epitaxial deposition process. In one cleaning method, for example, the substrate may be annealed in a hydrogen atmosphere at a temperature in excess of about 850° C. to 1000° C., using what may be referred to in the art as a hydrogen pre-bake. However, such high temperature processes are expensive in terms of thermal budgeting. After the pre-bake step, the epitaxial deposition process may be performed.

It is desirable, therefore, to provide processes that reduce the thermal load during epitaxy. There is also a need for pre-clean processes that are performed at epitaxial growth conditions.

SUMMARY

In one aspect of the present invention, a method for processing a substrate includes: introducing a substrate into a processing chamber; flowing an etching gas into the processing chamber; processing at least a portion of the substrate with the etching gas to remove a contaminated or damaged layer from a substrate surface; stopping flow of the etching gas; evacuating the processing chamber to achieve a reduced pressure in the chamber; and processing the substrate surface at the reduced pressure to form a cleaned substrate surface.

DETAILED DESCRIPTION

Figure 1:
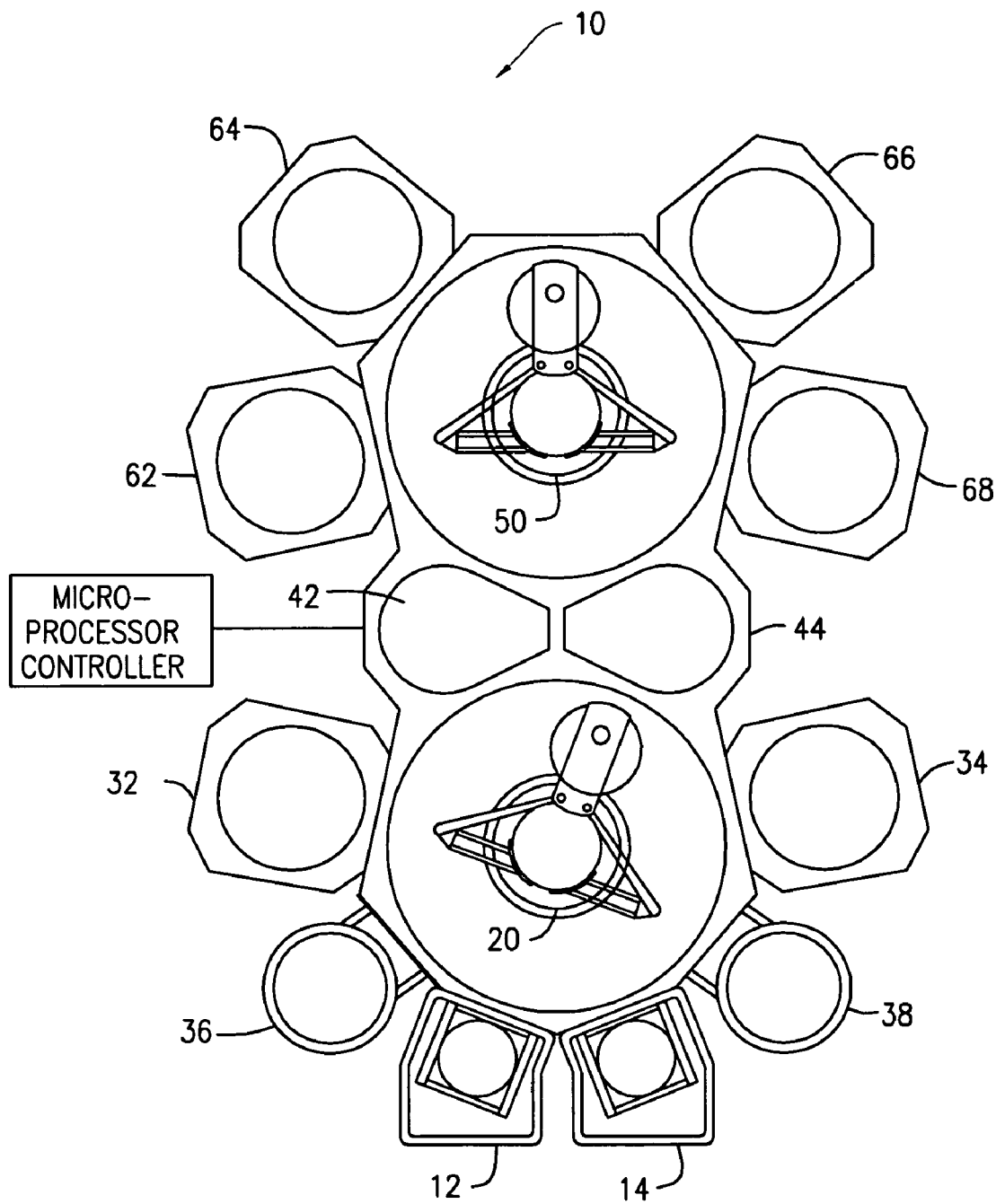
FIG. 1 shows a multi-chamber processing system according to one aspect of the invention.

Before describing several exemplary embodiments of the invention, it is to be understood that the invention is not limited to the details of construction or process steps set forth in the following description. The invention is capable of other embodiments and of being practiced or being carried out in various ways.

Aspects of the invention relate to systems, apparatus and methods for pre-cleaning substrates in epitaxy chambers. As will be appreciated by the skilled artisan, well-known semiconductor processing equipment and techniques relating to epitaxial deposition are not described in detail in the following so as to not unnecessarily obscure the present invention. Persons skilled in the art will readily recognize that process parameter values will vary significantly depending on the particular environment, substrate type, etc. As such, a comprehensive list of possible values and conditions is neither practical nor necessary, as such values can be determined once the principles of the present invention are known.

Embodiments of the invention relate to cleaning a substrate, for example, a silicon wafer, prior to epitaxial deposition, for example, prior to selective epitaxial deposition, using an etching gas. Selective Si-epitaxial deposition and SiGe-epitaxial deposition permits growth of epilayers on Si moats with no growth on dielectric areas. Selective epitaxy can be used in semiconductor devices, such as within elevated source/drains, source/drain extensions, contact plugs, and base layer deposition of bipolar devices. Generally, a selective epitaxy process involves two reactions: deposition and etch. The deposition and etch occur simultaneously with relatively different reaction rates on Si and on dielectric surface. A selective process window results in deposition only on Si surfaces by changing the concentration of an etchant gas (e.g., HCl).

Aspects of the invention may be carried out in one or more chambers of a cluster tool. Generally, a cluster tool is a modular system comprising multiple chambers which perform various functions including substrate center-finding and orientation, degassing, annealing, deposition and/or etching. According to an embodiment of the present invention, a cluster tool includes a chamber configured to perform both a pre-clean and selective epitaxial deposition process. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. However, the exact arrangement and combination of chambers may be altered for purposes of performing specific steps of a fabrication process, which includes the present cleaning process.

In one aspect of the present invention, a method for processing a substrate is provided, the method comprising: introducing a substrate into a processing chamber; flowing an etching gas into the processing chamber; processing at least a portion of the substrate with the etching gas to remove a contaminated or damaged layer from a substrate surface; stopping flow of the etching gas; evacuating the processing chamber to achieve a reduced pressure in the chamber; and processing the substrate surface at the reduced pressure to form a cleaned substrate surface. In one embodiment, the processing method further comprises depositing an epitaxial layer on the cleaned substrate surface. As an example, the step of forming an epitaxial layer on the substrate surface is done by selective epitaxy. In one embodiment, the selective epitaxy is performed on a portion of the cleaned surface that is surrounded by an insulator. In certain embodiments, the processing steps and the depositing step are done in the same chamber. In other embodiments, however, these steps may be performed in separate chambers, for example, in a cluster tool under a vacuum lock.

In another embodiment, the temperature of the substrate is from about 600° C. to about 850° C. In yet another embodiment, the temperature of the substrate is less than or equal to about 750° C.

In an embodiment, the methods further comprise increasing the pressure of the chamber before depositing the epitaxial layer on the substrate surface. In one example, the step of processing the substrate with the etching gas occurs at a pressure from approximately 10 torr to approximately 760 torr. In another example, the step of processing the substrate surface at the reduced pressure occurs at a pressure of approximately less than or equal to 1 torr.

In another embodiment, the etching gas comprises a halogen. For example, the etching gas can comprise HCl, $Cl_2$, $Br_2$, $CCl_4$, $CH_3Cl_3$, $(CH_2)_2Cl_2$, or mixtures thereof.

In yet another embodiment, the methods further comprise flowing a second gas comprising a Si-source gas, a Ge-source gas, or combinations thereof into the processing chamber. The Si-source gas can comprise, for example, silane ($SiH_4$). The Ge-source gas can comprise, for example, germane ($GeH_4$).

In a further embodiment, the methods comprise flowing a third gas comprising an unreactive gas into the chamber before the step of depositing an epitaxial layer on the cleaned substrate surface. In one example, the unreactive gas comprises $H_2$, $N_2$, Ar, He, or combinations thereof. In one example, the step of flowing the third gas comprising occurs substantially contemporaneously with the step of flowing the etching gas. The term "substantially contemporaneously" is meant to include at least some overlap in time during which both the hydrogen gas and the etching gas flow. The flows need not start and end at the same time, although in some instances this may be desirable.

In one embodiment, the flow rate of the etching gas is from about 10 sccm to about 15,000 sccm. In another embodiment, the flow rate of the second gas is from about 1 sccm to about 500 sccm. In a further embodiment, the flow rate of the third gas is from about 1 slm to about 100 slm.

In another embodiment, during the step of processing the substrate with the etching gas to expose a substrate surface, an etch rate is from about 1 Å per minute to about 30 Å per minute.

In one aspect of the invention, a method of supplying a semiconductor substrate is provided where the method comprises introducing a substrate into a processing chamber; flowing an etching gas into the processing chamber; processing at least a portion of the substrate with the etching gas to expose a substrate surface; stopping flow of the etching gas; evacuating the processing chamber to achieve a reduced pressure in the chamber; processing the substrate surface at the reduced pressure; and depositing an epitaxial layer on the substrate surface.

With respect to the figures, FIG. 1 shows an example of a cluster tool or multi-chamber processing system 10 that can be used in conjunction with an aspect of the invention. The processing system 10 can include one or more load lock chambers 12, 14 for transferring substrates into and out of the system 10. Typically, since the system 10 is under vacuum, the load lock chambers 12, 14 may "pump down" substrates introduced into the system 10. A first robot 20 may transfer the substrates between the load lock chambers 12, 14, and a first set of one or more substrate processing chambers 32, 34, 36, 38. Each processing chamber 32, 34, 36, 38, may be configured to perform a number of substrate processing operations. In particular, processing chamber 32 is a dry etch processor designed to practice a dry etch process described in the following, and processing chamber 34 is an epitaxial deposition reactor. Processing chambers 36, 38 may be configured to further provide, for example, cyclical layer deposition (CLD), atomic layer deposition (ALD), chemical vapor deposition (CVD), physical vapor deposition (PVD), etch, pre-clean, degas, orientation and other substrate processes.

The first robot 20 can also transfer substrates to/from one or more transfer chambers 42, 44. The transfer chambers 42, 44 can be used to maintain ultrahigh vacuum conditions while allowing substrates to be transferred within the system 10. A second robot 50 can transfer the substrates between the transfer chambers 42, 44 and a second set of one or more processing chambers 62, 64, 66, 68. Similar to processing chambers 32, 34, 36, 38, the processing chambers 62, 64, 66, 68 can be configured to perform a variety of substrate processing operations, including the dry etch processes described in the following, in addition to cyclical layer deposition (CLD), atomic layer deposition (ALD), chemical vapor deposition (CVD), physical vapor deposition (PVD), epitaxial deposition, etch, pre-clean, degas, and orientation. Any of the substrate processing chambers 32, 34, 36, 38, 62, 64, 66, 68 may be removed from the system 10 if not needed.

Figure 2A:
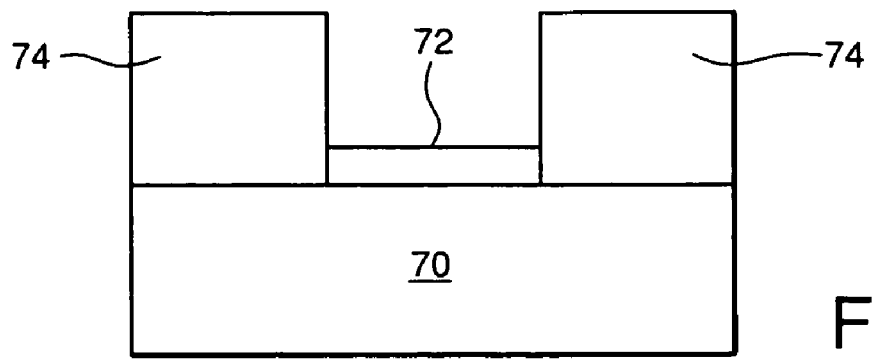
FIGS. 2A-2C show a substrate being processed according to an embodiment of the present invention.
Figure 2B:
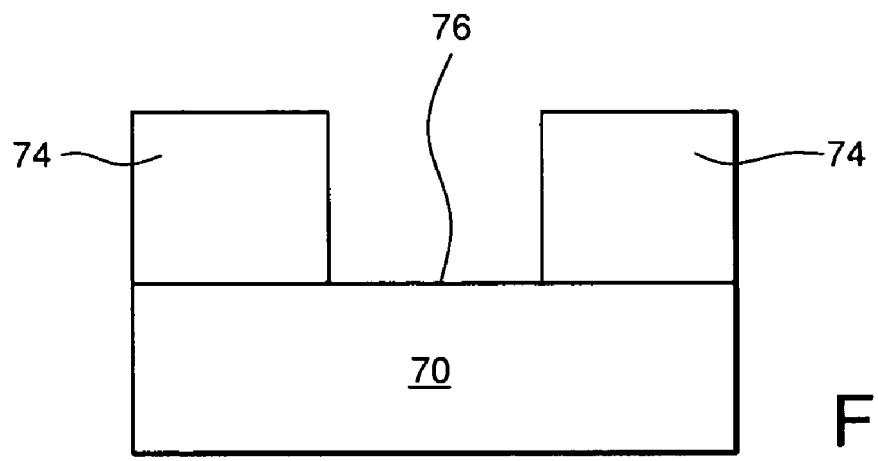
Figure 2C:
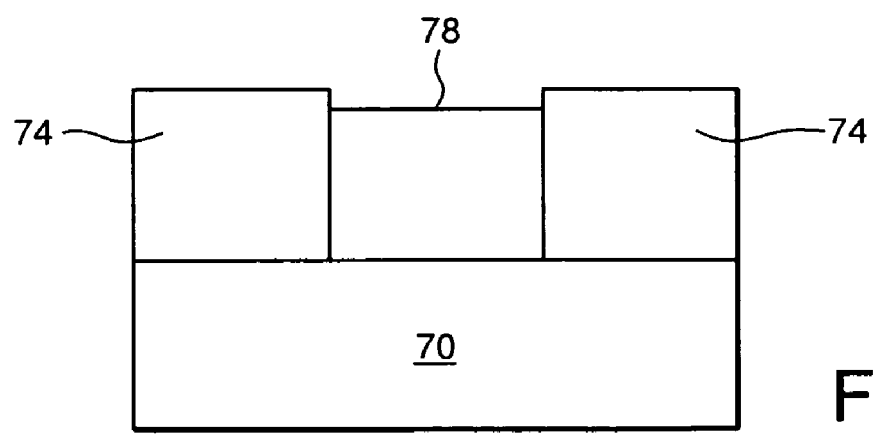

Referring now to FIGS. 2A-2C, an example of an epitaxial deposition process includes a pre-clean step to remove surface damage and contaminants 72 from a substrate 70, followed by an epitaxial deposition process. To this end, prior to performing the epitaxial deposition process, the substrate 70 to be processed is loaded into a processing chamber to undergo an etching process that removes damage and contaminants 72 to expose a substrate surface 76. During the etching process, it is likely that components of the etching gas lay down a passivated layer on the substrate surface that needs to be removed. To remove the passivated layer, a vacuum bake is done in the processing chamber where the flow of the etching gas is stopped and the pressure of the processing chamber is reduced to, for example, less than 1 torr. The substrate surface 76, as shown in FIG. 2B, is then suitable to sustain the subsequent growth of an epitaxial layer. In some instances, it is desirable to perform epitaxy on a portion of the substrate surface 76 that is surrounded by insulation 74.

The epitaxial deposition process may be carried out by chemical vapor deposition performed within the processing chamber where the pre-cleaning etching took place, such as within an EPI CENTURA reactor from Applied Materials of Santa Clara, Calif., to form an epitaxial layer 78 on the substrate surface 76. The surface 76 of the substrate 70 may be exposed, for example, to silicon in the form of a deposition gas mixture that comprises silicon (e.g., $SiCl_4$, $SiHCl_3$, $SiH_2Cl_2$, $SiH_3Cl$, $Si_2H_6$, or $SiH_4$) and a carrier gas (such as $N_2$, Ar, and/or $H_2$). If the intended use of the substrate 70 requires that the epitaxial layer 78 include a dopant, the silicon-containing gas may also include a suitable dopant-containing gas, such as arsine ($AsH_3$), phosphine ($PH_3$), and/or diborane ($B_2H_6$).

EXAMPLES

Figure 3:
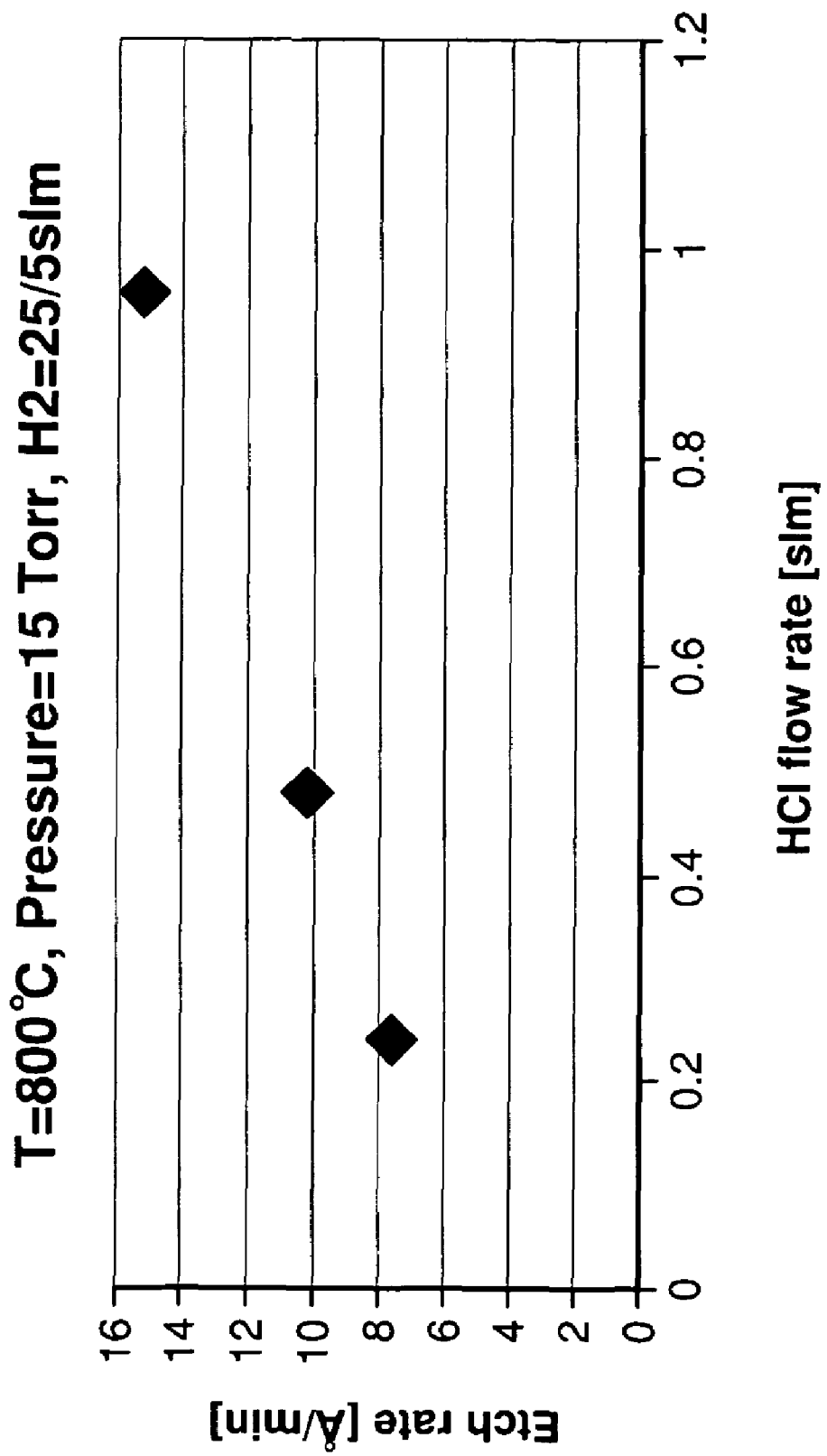
FIG. 3 shows a graphical representation of etch rate (Å/min) versus HCl flow rate (slm) for an embodiment of the present invention.

In one example, substrates were processed at a temperature of 800° C., a pressure of 15 torr, a hydrogen flow rate of 25/5 slm, and the HCl flow rate was varied. FIG. 3 shows that an increase in the HCl flow rate results in a higher etch rate (Å/min).

In other examples, substrates were processed according to queue times of zero, 4-hours, and 8-hours. A summary of the runs, including identifiers of the pre-clean processing parameters is shown in Table 1. A key to the processing parameters is provided in Table 2.

TABLE 1

Summary of Pre-clean processing conditions

| Pre-clean processing parameters | | | | Queue Time (hours) | Wafer type |
|---|---|---|---|---|---|
| G1 | V | | | 0 | Bare |
| G1 | | | | 0 | Bare |
| G1 | V | H | | 0 | Bare |
| G1 | V | H | | 0 | Patterned |
| G2 | V | H | | 0 | Bare |
| G3 | V | H | | 0 | Patterned |
| G4 | V | H | | 0 | Bare |
| G5 | V | H | | 0 | Patterned |
| G3 | V | | S | 0 | Patterned |
| S1 | V | H | S | 0 | Bare |
| S1 | V | H | S | 0 | Patterned |
| S1 | V | H | | 0 | Patterned |
| S1 | V | H | S | 4 | Bare |
| S1 | V | H | S | 4 | Patterned |
| G1 | | | | 8 | Bare |
| G1 | V | H | | 8 | Bare |
| G2 | V | H | | 8 | Bare |
| S1 | V | H | S | 8 | Bare |
| S1 | V | H | S | 8 | Patterned |
| S1 | V | H | | 8 | Patterned |
| S2 | V | H | | 8 | Patterned |
| S2 | V | H | | 8 | Bare |
| S3 | V | H | | 8 | Bare |
| | V | H | | 8 | Patterned |
| | V | H | | 8 | Bare |

TABLE 2

Processing parameters

| Parameter | Temp (° C.) | Pressure (torr) | GeH$_4$/SiH$_4$ Flow (sccm) | HCl flow (sccm) | H$_2$ (slm) | Time (sec) | Etch Rate on Bare wafers (Å/min) |
|---|---|---|---|---|---|---|---|
| G1 | 715 | 10 | GeH$_4$ = 160 | HCl = 360 | 5/5 | 180 | 9 |
| G2 | 715 | 10 | GeH$_4$ = 160 | HCl = 360 | 5/5 | 300 | 9 |
| G3 | 715 | 10 | GeH$_4$ = 160 | HCl = 360 | 5/5 | 60 | 9 |
| G4 | 715 | 20 | GeH$_4$ = 240 | HCl = 540 | 5/5 | 300 | 30 |
| G5 | 715 | 20 | GeH$_4$ = 50 | HCl = 540 | 5/5 | 120 | 7 |
| S1 | 715 | 80 | SiH$_4$ = 15 | HCl = 1000 | 5/5 | 600 | 1 |
| S2 | 715 | 200 | SiH$_4$ = 15 | HCl = 1000 | 5/5 | 600 | 1.7 |
| S3 | 715 | 80 | SiH$_4$ = 0 | HCl = 15000 | 5/5 | 600 | 4.2 |
| V | 715 | <1 | | | 0/0 | 120 | N/A |
| H | 715 | <5 | | | 35/5 | 60 | N/A |
| S | 715 | 20 | DCS = 400 | HCl = 30 | 25/5 | 278 | GR = 6.5 |
| SiGeB | 650 | 15 | SiH$_4$ = 100 GeH$_4$ = 260 B$_2$H$_6$ = 50 (MR = 98%) | HCl = 160 | 25/5 | 1000 | GR = 32.2 |

Figure 4:
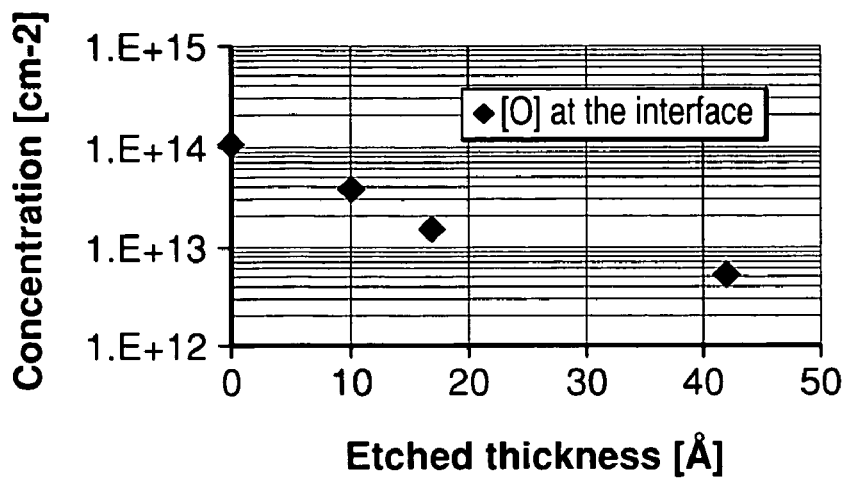
FIG. 4 shows a graphical representation of concentration of O ($cm^{-2}$) versus etched thickness (Å) for an embodiment of the present invention.
Figure 5:
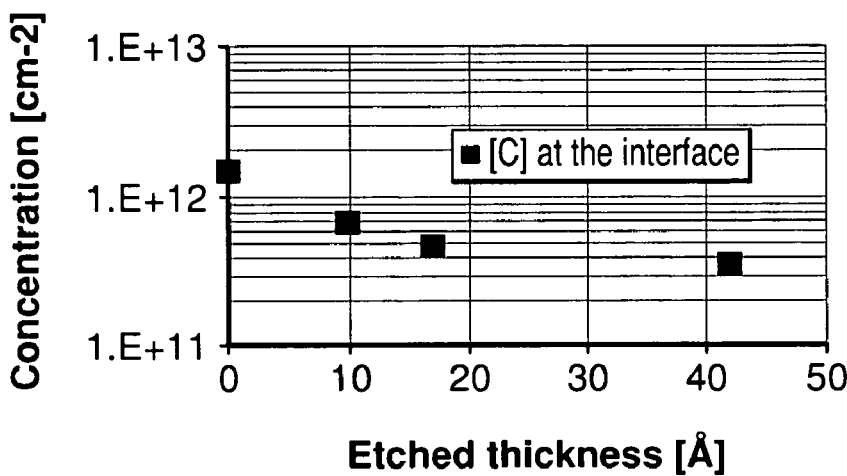
FIG. 5 shows a graphical representation of concentration of C ($cm^{-2}$) versus etched thickness (Å) for an embodiment of the present invention.
Figure 6:
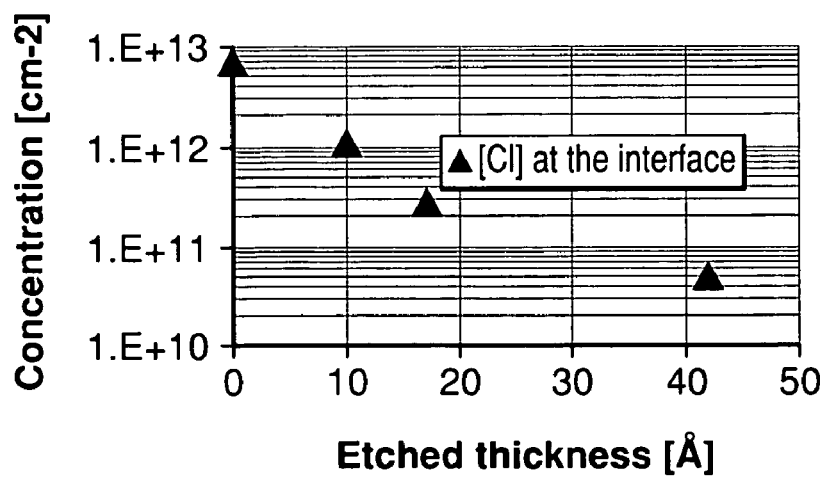
FIG. 6 shows a graphical representation of concentration of Cl ($cm^{-2}$) versus etched thickness (Å) for an embodiment of the present invention.

FIGS. 4, 5, and 6 graphically depict concentrations (cm$^{-2}$) of O, C, and Cl, respectively, at the cleaned substrate interface for runs having conditions of S1, S2, S3, and a control of no etching. These figures show that as the thickness of the substrate that is etched increases, the amount of interface contamination decreases on the substrate.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed:

1. A method for processing a substrate comprising:
   introducing a substrate into a processing chamber;
   flowing an etching gas into the processing chamber;
   processing at least a portion of the substrate having a monocrystalline surface with the etching gas to remove a contaminated or damaged layer from the monocrystalline substrate surface;
   stopping flow of the etching gas;
   evacuating the processing chamber to achieve a reduced pressure in the chamber;
   processing the monocrystalline substrate surface at the reduced pressure to form a cleaned monocrystalline substrate surface; and
   depositing an epitaxial layer on the cleaned monocrystalline substrate surface.

2. The method of claim 1, further comprising increasing the pressure of the chamber before depositing the epitaxial layer on the cleaned monocrystalline substrate surface.

3. The method of claim 1, wherein the flow rate of the etching gas is from about 10 sccm to about 15,000 sccm.

4. The method of claim 1 wherein during the step of processing the substrate with the etching gas to remove a contaminated or damaged layer from the monocrystalline substrate surface, occurs at an etch rate from about 1 Å per minute to about 30 Å per minute.

5. The method of claim 1 wherein the step of processing the substrate with the etching gas to expose a monocrystalline substrate surface occurs at a pressure from approximately 10 torr to approximately 760 torr.

6. The method of claim 1 wherein the step of processing the monocrystalline substrate surface at the reduced pressure occurs at a pressure of approximately less than or equal to 1 torr.

7. The method of claim 1, wherein the epitaxial deposition step is performed in the same processing chamber as etching and reduced pressure steps.

8. The method of claim 1, wherein the temperature of the substrate during the step of flowing the etching gas is from about 600° C. to about 850° C.

9. The method of claim 8, wherein the temperature of the substrate during the step of flowing the etching gas is less than or equal to about 750° C.

10. The method of claim 1, wherein the etching gas comprises a halogen.

11. The method of claim 10, wherein the etching gas comprises HCl, $Cl_2$, $Br_2$, $CCl_4$, $CH_3Cl_3$, $(CH)_2Cl_2$, or mixtures thereof.

12. The method of claim 1 wherein the step of forming an epitaxial layer on the cleaned monocrystalline substrate surface is done by selective epitaxy.

13. The method of claim 12, wherein the selective epitaxy is performed on a portion of the cleaned monocrystalline substrate surface is surrounded by an insulator.

14. The method of claim 1, further comprising flowing a third gas comprising an unreactive gas into the chamber before the step of depositing an epitaxial layer on the cleaned monocrystalline substrate surface.

15. The method of claim 14, wherein the unreactive gas comprises $H_2$, $N_2$, Ar, He, or combinations thereof.

16. The method of claim 14, wherein the flow rate of the third gas is from about 1 slm to about 100 slm.

17. The method of claim 1, further comprising flowing a second gas comprising a Si-source gas, a Ge-source gas, or combinations thereof into the processing chamber.

18. The method of claim 17, wherein the Si-source gas comprises silane ($SiH_4$).

19. The method of claim 17, wherein the Ge-source gas comprises germane ($GeH_4$).

20. The method of claim 17, wherein the flow rate of the second gas is from about 1 sccm to about 500 sccm.

* * * * *